US009304166B2

(12) United States Patent
Zhaojun

(10) Patent No.: US 9,304,166 B2
(45) Date of Patent: Apr. 5, 2016

(54) METHOD AND SYSTEM FOR WAFER LEVEL TESTING OF SEMICONDUCTOR CHIPS

(75) Inventor: Shao Zhaojun, Xian (CN)

(73) Assignee: INFINEON TECHNOLOGIES AG, Neubiberg (DE)

(*) Notice: Subject to any disclaimer, the term of this patent is extended or adjusted under 35 U.S.C. 154(b) by 1038 days.

(21) Appl. No.: 12/837,596

(22) Filed: Jul. 16, 2010

(65) Prior Publication Data

US 2012/0013359 A1 Jan. 19, 2012

(51) Int. Cl.
*G01R 31/02* (2006.01)
*G01R 31/3185* (2006.01)
*H01L 21/00* (2006.01)

(52) U.S. Cl.
CPC *G01R 31/318511* (2013.01); *G01R 31/318563* (2013.01); *H01L 21/00* (2013.01); *H01L 2924/00* (2013.01)

(58) Field of Classification Search
CPC . H01L 21/00; H01L 2021/00; H01L 2221/00; H01L 2223/00; H01L 2924/00; H01L 2925/00
USPC ............... 324/750.15, 750.3, 762.01, 762.03, 324/762.05, 762.06; 702/57–59; 714/733–734
See application file for complete search history.

(56) References Cited

U.S. PATENT DOCUMENTS 3,781,683 A * 12/1973 Freed ............ G01R 31/318538 324/73.1
3,849,872 A 11/1974 Hubacher
4,749,947 A 6/1988 Gheewala
5,648,661 A 7/1997 Rostoker et al.
6,046,600 A * 4/2000 Whetsel ........... G01R 31/31715 324/762.03
6,366,110 B1 * 4/2002 Buck ....................... H01L 22/32 324/754.03
6,710,616 B1 * 3/2004 D'Souza ................. 324/750.05
6,988,232 B2 1/2006 Ricchetti et al.
7,757,139 B2 7/2010 Hua
2004/0240581 A1 * 12/2004 Salapski ....................... 375/295
2005/0099173 A1 * 5/2005 Siade et al. ................ 324/158.1
2005/0174131 A1 * 8/2005 Miller .......................... 324/754
2006/0279310 A1 * 12/2006 Walker et al. ................ 324/765
2007/0241766 A1 * 10/2007 Kamitai et al. ............... 324/763
2008/0130388 A1 * 6/2008 Mimoto ........................ 365/201
2008/0229163 A1 9/2008 Niijima et al.
2009/0102503 A1 * 4/2009 Saito ............................ 324/765
2009/0138771 A1 5/2009 Hua
2009/0206863 A1 8/2009 McGarry
2009/0271140 A1 10/2009 Tashiro
2010/0117678 A1 * 5/2010 Nakabayashi ................ 324/765

FOREIGN PATENT DOCUMENTS

CN 1908690 A 2/2007
CN 101147206 A 3/2008
CN 101572538 A 11/2009

* cited by examiner

*Primary Examiner* — Huy Q Phan
*Assistant Examiner* — Temilade Rhodes-Vivour

(57) ABSTRACT

A system and method for wafer level testing of semiconductor chips are provided. In one embodiment, the system comprises a plurality of semiconductor chips disposed in a wafer, each semiconductor chip having at least one port for receiving test data and at least one connection disposed in a kerf region of the wafer between at least one port of a first semiconductor chip and at least one port of at least one second semiconductor chip in the plurality of semiconductor chips, wherein the first semiconductor chip is configured to send the test data to the at least one second semiconductor chip via the at least one connection. Additionally, the plurality of semiconductor chips may comprise at least one core logic configured to pass the test data to the at least one second semiconductor chip via the at least one connection.

23 Claims, 10 Drawing Sheets

ATE
102
Probe Card
104
DIE N
DIE 2
DIE 1
106
116
108

102
ATE
Probe Card 104
106
112
110
116
114
108

300
DIE
310
310
302
304
306
308
Port A
Port B
Port C
Port D

102
ATE
TRST TDI TMS TCK
TDO
TDO
TDO
TDO
Probe Card 104
DIE
122
302
304
306
308
310
310
TCK 402
TMS 404
TDI 406
TRST 408
TDO 410

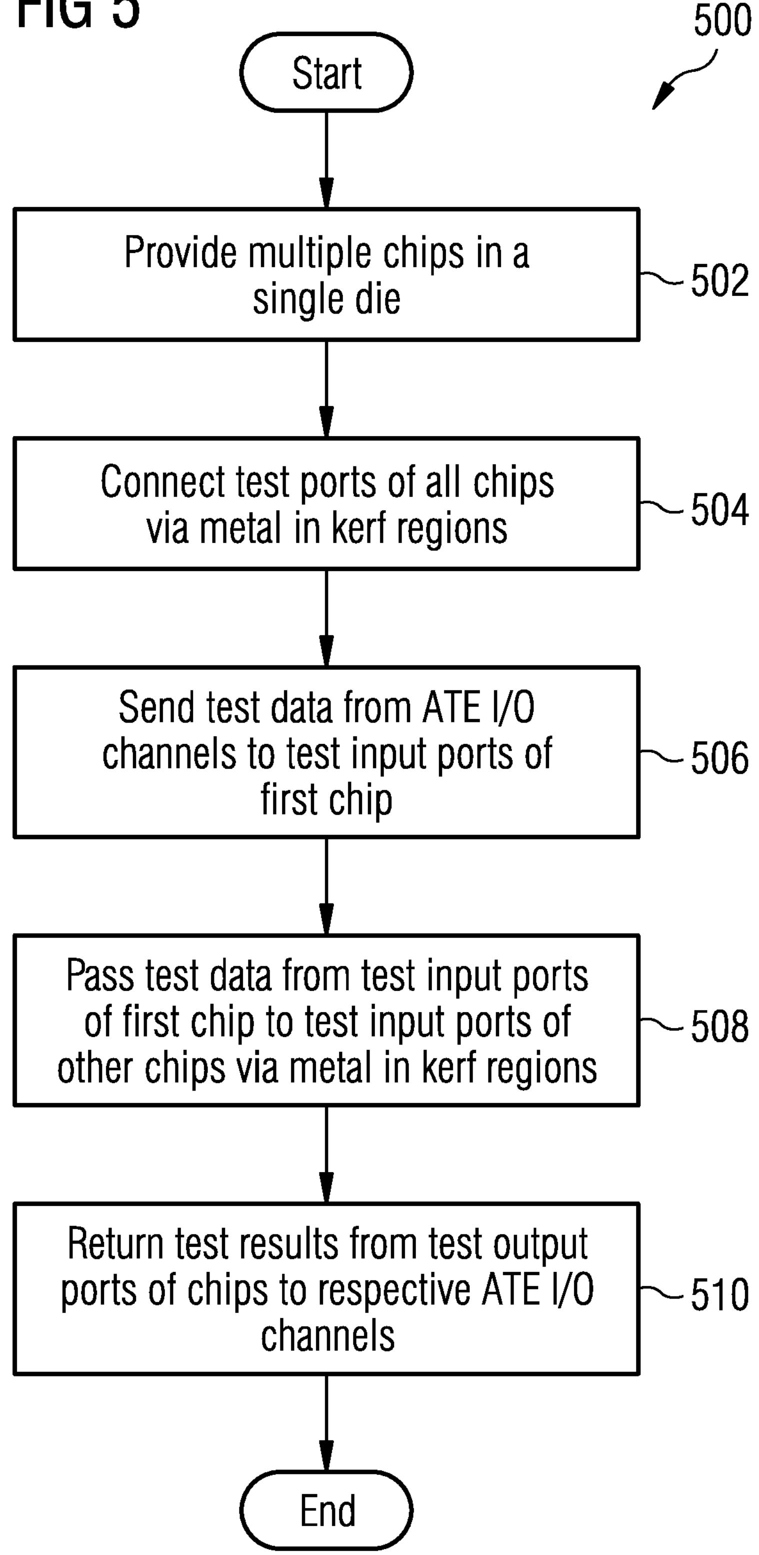
FIG 5
500
Start
Provide multiple chips in a single die
502
Connect test ports of all chips via metal in kerf regions
504
Send test data from ATE I/O channels to test input ports of first chip
506
Pass test data from test input ports of first chip to test input ports of other chips via metal in kerf regions
508
Return test results from test output ports of chips to respective ATE I/O channels
510
End 602
DIE
604
606
608
610
612
614
Port A
Port B
Port C
Port D
Port E
Port 1
Port 2
Port 3
Port 4
Port 5
JTAG
core logic
core logic
testmode_s
1
0

102
ATE
TRST TCK TDI TMS
TDO
TDO
Probe Card 104
716 TDO
716 TDO
DIE
700
704
706
708
710
712
714
TMS
TDI
TCK
TRST
Port A
Port B
Port C
Port D
MUXs
testmode_s
JTAG
core logic
720
722
724
726
718
4

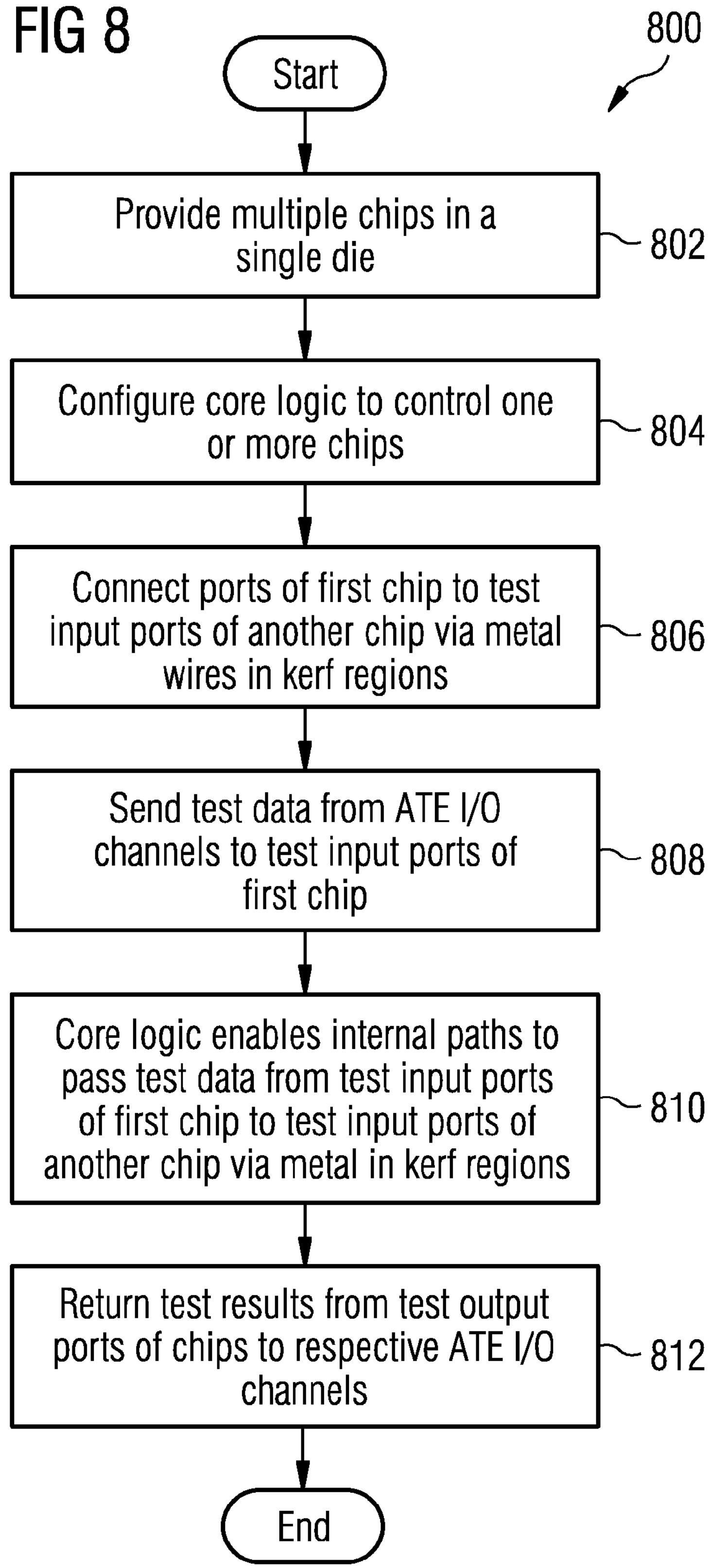
FIG 8
800
Start
Provide multiple chips in a single die
802
Configure core logic to control one or more chips
804
Connect ports of first chip to test input ports of another chip via metal wires in kerf regions
806
Send test data from ATE I/O channels to test input ports of first chip
808
Core logic enables internal paths to pass test data from test input ports of first chip to test input ports of another chip via metal in kerf regions
810
Return test results from test output ports of chips to respective ATE I/O channels
812
End ATE
TDO
TDO
TDO
TRST TCK TDI TMS
102
Probe Card 104
916 TDO
916 TDO
916 TDO
DIE
900
904
906
930
908
910
912
914
TMS
TDI
TCK
TRST
Port A
Port B
Port C
Port D
Port E
F
G
H
MUXs
JTAG
core logic
testmode_s
918
920
922
924
926
932
934

102
ATE
TRST TCK TDI TMS
TDO
TDO
TDO
Probe Card
104
1016 TDO
1016 TDO
1016 TDO
1000
DIE
1004
1006
1030
JTAG
core logic
MUXs
testmode_s
Port A
Port B
Port C
Port D
TMS
TDI
TCK
TRST
1008
1010
1012
1014
1018
1020
1022
1024
1026
1032
1034
4

METHOD AND SYSTEM FOR WAFER LEVEL TESTING OF SEMICONDUCTOR CHIPS

TECHNICAL FIELD

The present invention relates generally to testing of multiple semiconductor chips. In particular, the present disclosure relates to parallel testing of multiple semiconductor chips at the wafer level.

BACKGROUND

Testing of semiconductor chips has been challenging for many manufacturers due to its impact on production costs. Many measures including increase of test system throughputs have been implemented to cut testing costs. For example, parallel testing of multiple dies was introduced in automated test systems, such as automated test equipment (ATE), in order to cut testing costs. However, at the wafer level in which a wafer has hundreds of chips, parallel testing becomes difficult due to the need for multiple input/output (IO) channels for each semiconductor chips. Therefore, a need exists for a method and system to perform parallel wafer level testing on multiple semiconductor chips that requires less resource from the automated test systems.

BRIEF DESCRIPTION OF DRAWINGS

FIG. 5 is a flowchart of an exemplary process for parallel testing of multiple semiconductor chips in accordance with one embodiment of the present disclosure.

FIG. 8 is a flowchart of an exemplary process for parallel testing of multiple semiconductor chips in accordance with an alternative embodiment of the present disclosure.

SUMMARY OF INVENTION

Figure 1:
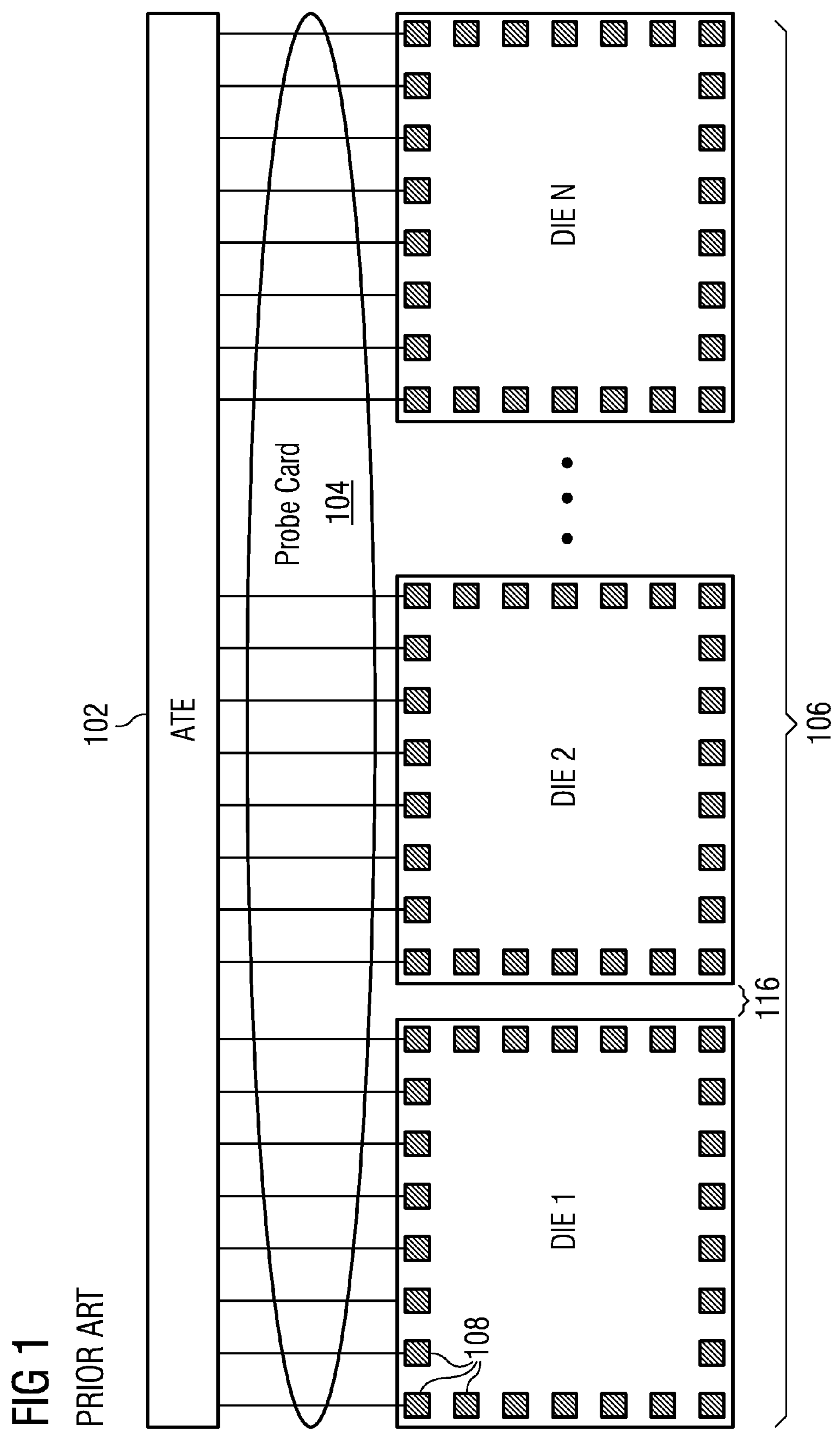
FIG. 1 is a diagram of a system for testing of multiple semiconductor chips in accordance with the prior art.

In one embodiment, a system for testing semiconductor chips is provided. The system comprises a plurality of semiconductor chips disposed in a wafer, each of the plurality of semiconductor chips having at least one port for receiving test data, at least one connection disposed in a kerf region of the wafer between at least one port of a first semiconductor chip and at least one port of at least one second semiconductor chip in the plurality of semiconductor chips, wherein the first semiconductor chip is configured to send the test data to the at least one second semiconductor chip via the at least one connection.

The at least one connection comprises a first connection disposed in the kerf region between a first port of the first semiconductor chip and a first port of the at least one second semiconductor chip, and a second connection disposed in the kerf region between a second port of the first semiconductor chip and a second port of the at least one second semiconductor chip.

The first semiconductor chip is configured to send the test data to the at least one second semiconductor chip via the first connection and the second connection simultaneously.

The system further comprises an automated test equipment comprising at least one channel coupled to the at least one test input port of the first semiconductor chip, and at least one channel coupled to at least one test output port of the plurality of semiconductor chips, wherein the first semiconductor chip is configured to receive the test data from the at least one channel of the automated test equipment at the at least one test input port of the first semiconductor chip.

The first semiconductor is configured to send the test data received at the at least one test input port to the at least one test input port of the at least one second semiconductor chip via the at least one connection.

A method for testing semiconductor chips is also provided in another embodiment of the present disclosure in which a plurality of semiconductor chips is provided in a wafer, at least one port of the plurality of semiconductor chips is connected via at least one connection in a kerf region of the wafer, test data is sent from a tester to the at least one port of a first semiconductor chip in the plurality of semiconductor chips, and the test data is passed from the at least one port of the first semiconductor chip to at least one port of at least one second semiconductor chip via the at least one connection.

The test data is received from at least one channel of the tester at the first port and the second port of the first semiconductor chip and sent to the first port and the second port of the at least one second semiconductor chip via the first connection and second connection simultaneously.

In an alternative embodiment, a system for testing semiconductor chips comprising a plurality of semiconductor chips being disposed in a wafer, each of the plurality of semiconductor chips having at least one port for receiving test data and at least one core logic, at least one connection disposed in a kerf region of the wafer between at least one port of a first semiconductor chip and at least one port of at least one second semiconductor chip in the plurality of semiconductor chips, wherein the core logic of the first semiconductor chip is configured to pass the test data to the at least one second semiconductor chip via the at least one connection.

The at least one port of the first semiconductor chip comprises a first set of ports coupled to a tester and a second set of ports coupled to the at least one port of the at least one second semiconductor chip via the at least one connection.

The core logic of the first semiconductor chip is configured to connect the first set of ports with the second set of ports via at least one internal path and pass the test data from the second set of ports to the at least one port of the at least one second semiconductor chip via the at least one connection.

In addition, the second set of ports are coupled to at least one port of a second semiconductor chip and at least one port of a third semiconductor chip and the core logic of the first semiconductor chip is configured to pass the test data from the second set of ports to at least one port of the second semiconductor chip via a first subset of the at least one connection, and to at least one port of the third semiconductor chip via a second subset of the at least one connection.

The first semiconductor chip further comprises a third set of ports coupled to the at least one port of a third semiconductor chip via a second subset of the at least one connection, wherein the core logic of the first semiconductor chip is configured to pass the test data from the second set of ports to at least one port of the second semiconductor chip via the first subset of the at least one connection, and from the third set of ports to at least one port of the third semiconductor chip via a second subset of the at least one connection.

In yet another alternative embodiment, a method for testing semiconductor chips is provided. A plurality of semiconductor chips is provided in a wafer, at least one core logic is configured to control the plurality of semiconductor chips, at least one port of the plurality of semiconductor chips is connected via at least one connection in a kerf region of the wafer, and test data is sent from a tester to the at least one port of a first semiconductor chip in the plurality of semiconductor chips and passed from the at least one port of the first semiconductor chip to at least one port of at least one second semiconductor chip via the at least one connection.

The core logic is configured to connect a first set of ports of the first semiconductor chip to a second set of ports of the first semiconductor chip upon the first semiconductor chip entering a test mode. The test data is received from at least one channel of the tester at the first set of ports of the first semiconductor chip and sent from the first set of ports to the second set of ports of the first semiconductor chip via at least one internal path.

The second set of ports of the first semiconductor chip is connected to at least one port of a second semiconductor chip of the at least one second semiconductor chip via a first subset of the at least one connection and to at least one port of a third semiconductor chip of the at least one second semiconductor chip via a second subset of the at least one connection.

The test data is sent from the second set of ports of the first semiconductor chip to at least one port of the second semiconductor chip of the at least one second semiconductor chip via the first subset of the at least one connection, and from the second set of ports of the first semiconductor chip to at least one port of the third semiconductor chip of the at least one second semiconductor chip via the second subset of the at least one connection simultaneously.

The core logic is configured to connect a third set of ports of the first semiconductor chip upon the first semiconductor chip entering a test mode. The second set of ports of the first semiconductor chip is connected to at least one port of a second semiconductor chip of the at least one second semiconductor chip via a first subset of the at least one connection. The third set of ports of the first semiconductor chip is connected to at least one port of a third semiconductor chip of the at least one second semiconductor chip via a second subset of the at least one connection.

The test data is then sent from the second set of ports of the first semiconductor chip to at least one port of the second semiconductor chip of the at least one second semiconductor chip via the first subset of the at least one connection and from the third set of ports of the first semiconductor chip to at least one port of the third semiconductor chip of the at least one second semiconductor chip via the second subset of the at least one connection simultaneously.

DETAIL DESCRIPTION

Many of the various disclosed embodiments relate to a system including a plurality of semiconductor chips in a wafer and further including at least one connection between the plurality of chips in kerf regions of the wafer. In addition, the present disclosure provides a method for parallel testing of a plurality of semiconductor chips using at least one connection between the plurality of chips over the kerf regions. Specific details of certain embodiments of the invention are set forth in the following description and Figures to provide a thorough understanding of such embodiments. One skilled in the art, however, will understand that other embodiments are possible, and that many embodiments may be practiced without several of the details described herein.

Referring to FIG. 1, a diagram of a system for testing of multiple semiconductor chips is depicted in accordance with the prior art. As shown in FIG. 1, system 100 comprises automated test equipment (ATE) 102. Traditionally, the automated test equipment 102 is connected to a plurality of semiconductor chips 106 through a probe card 104. Probe card 104 provides an interface between the automated test equipment 102 to a wafer having a plurality of semiconductor chips 106. Probe card 104 comprises a plurality of contact elements that provides electrical contacts between the plurality of semiconductor chips 106 on the wafer and the automated test equipment 102. In this example, the automated test equipment comprises 1024 input/output (I/O) channels and each of the plurality of semiconductor chips 106 comprises 20 pins for testing. Therefore, up to 51 semiconductor chips may be tested in parallel. Each semiconductor chip 106 comprises a plurality of contacts or pads 108, which are used by the probe card 104 for testing. In this example, each I/O channel of the ATE 102 is connected a contact or pad 108 of a semiconductor chip 106.

Figure 2:
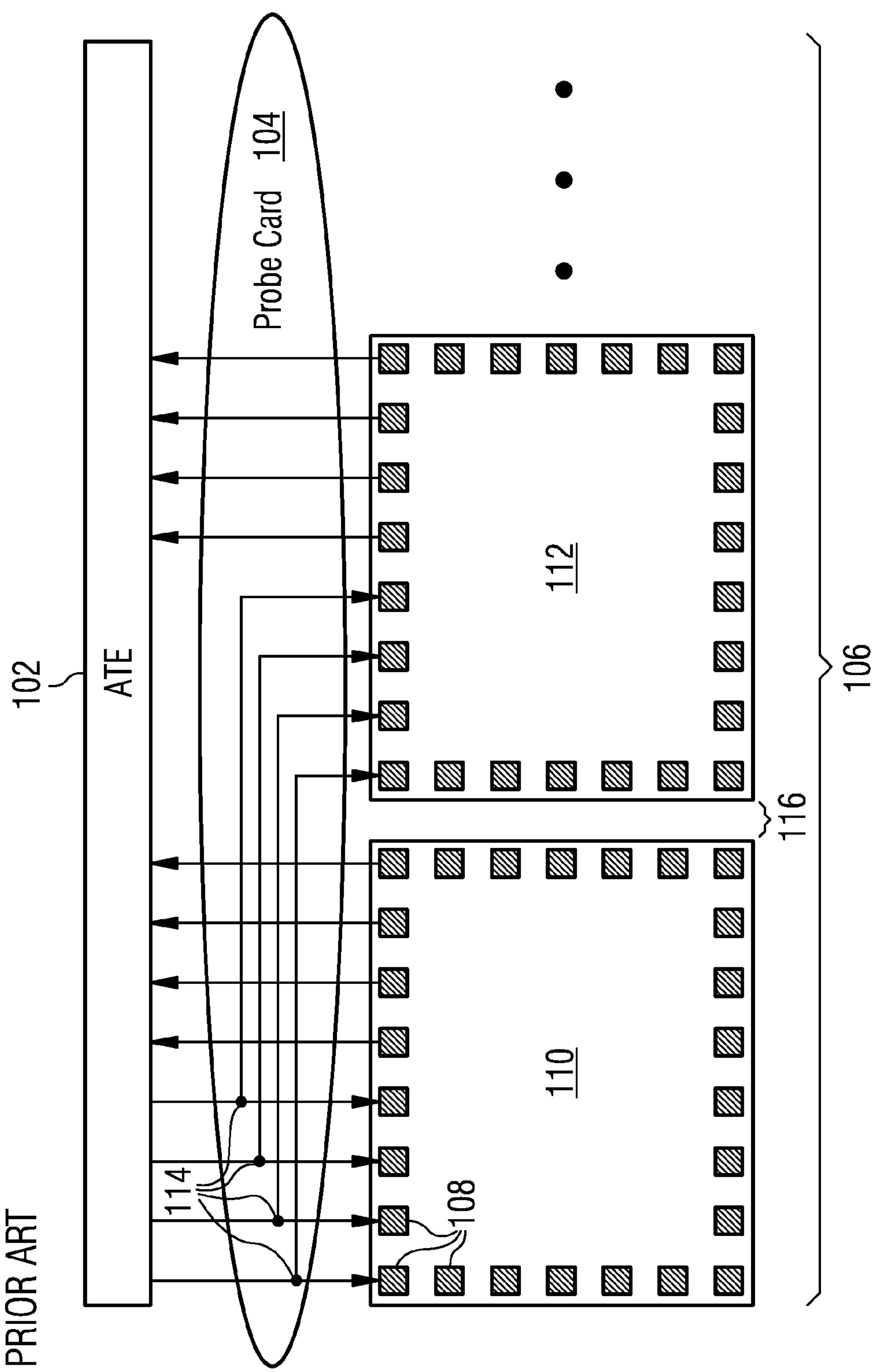
FIG. 2 is a diagram of a system for testing of multiple semiconductor chips in accordance with the prior art.

Referring to FIG. 2, a diagram of a system for testing of multiple semiconductor chips is depicted in accordance with the prior art. In FIG. 2, instead of a one-to-one connection between the I/O channels of the automated test equipment 102 and the contacts or pads 108 of each semiconductor chip 106, some of the connections between the automated test equipment 102 and the contacts or pads 108 are shared by two or more semiconductor chips 106. In this example, connections between the automated test equipment and the contacts or pads of chip 110 are shared by chip 112 via connections 114. The sharing of connections 114 via pins enables parallel testing of two or more semiconductor chips 106, in this case chips 110 and 112, with less required I/O channels. In both prior art approaches as shown in FIGS. 1 and 2, however, the connections are present in the probe card 104 and no connections are present in the kerf regions 116 between two or more semiconductor chips 106.

The present disclosure provides a method to perform wafer level parallel testing of multiple semiconductor chips with less input/output channels required for each chip. In addition, a system for facilitating such wafer level parallel testing is also provided. The present disclosure utilizes the kerf regions 116 between two or more semiconductor chips 106 to connect corresponding contacts or pads 108 of two or more semiconductor chips 106 in order to provide data paths between the chips 106. In one embodiment, a special parallel testing chip is provided which connects the corresponding contacts or pads 108 of up to $n^2$ number of chips 106. Through this special chip, multiple semiconductor chips may be tested simultaneously with a single set of I/O channels from the automated test equipment 102 that typically only accommodates one semiconductor chip.

Figure 3:
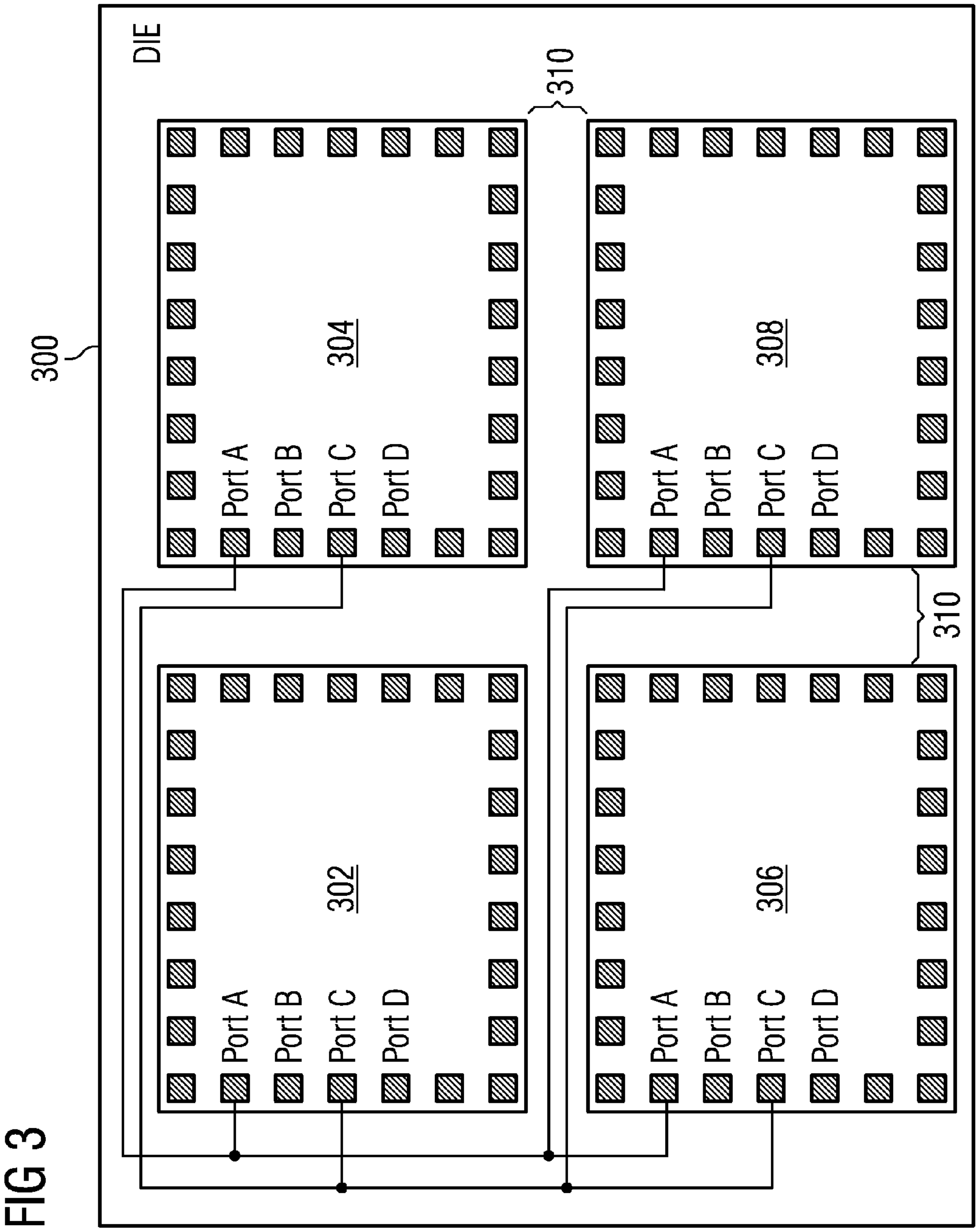
FIG. 3 is a diagram of a system for wafer level parallel testing of multiple semiconductor chips in accordance with one embodiment of the present disclosure.

Referring to FIG. 3, a diagram illustrating a system for wafer level parallel testing of multiple semiconductor chips is depicted in accordance with one embodiment of the present disclosure. In this embodiment, a plurality of identical semiconductor chips, for example, chips 302, 304, 306, and 308 are placed in a single die 300. Each chip comprises four test ports, in this example, port A, B, C, and D. Chip 302 is a special parallel testing chip that connects corresponding ports of chips 304, 306 and 308 to provide data paths between the chips.

In this case, test port A of chips 304, 306 and 308 are connected via metal wires in kerf regions 310 to test port A of chip 302. Similarly, test port C of chips 304, 306 and 308 are connected via metal wires in kerf regions 310 to test port C of chip 302. In this way, test signals sent from automated test equipment 102 to port A and C of chip 302 are also sent to chips 304, 306 and 308 simultaneously. Thus, the typical one-to-one connection between the I/O channels of the automated test equipment 102 and the contacts or pads of each semiconductor chip may now be one-to-multiple chip connections. With this configuration, less I/O channels are required from the ATE 102 to test multiple semiconductor chips. This means that more chips may be tested at the wafer level simultaneously with the same number of ATE I/O channels. As a result, testing costs for multiple semiconductor chips may be reduced.

Figure 4:
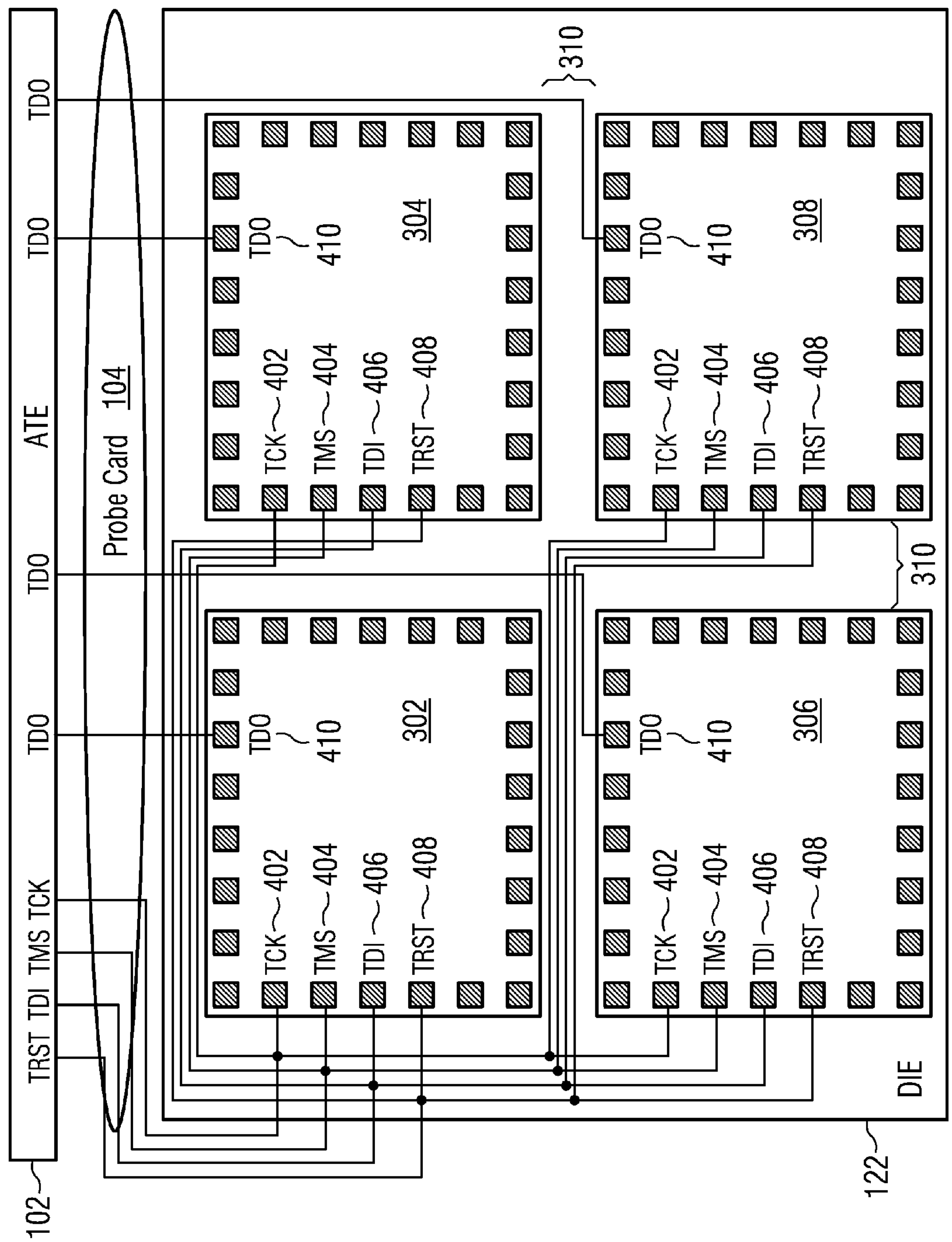
FIG. 4 is a diagram of one exemplary implementation of a system for wafer level parallel testing of multiple semiconductor chips in accordance with one embodiment of the present disclosure.

Referring to FIG. 4, a diagram of one exemplary implementation of a system for wafer level parallel testing of multiple semiconductor chips is depicted in accordance with one embodiment of the present disclosure. In this exemplary implementation, parallel testing of chips 302, 304, 306 and 308 may be performed via four JTAG signals: TCK 402, TMS 404, TDI 406, and TRST 408. Automated test equipment 102 may configure chips 302, 304, 306 and 308 via these four signals to invoke a specific test, for example, ATPG test, memory test, etc. The result of the test may be returned via TDO 410 signal.

For test input signals, the four JTAG signals of chips 302, 304, 306 and 308 are connected via metal wires in the kerf regions 310 and the four JTAG signals of chip 302 are connected to the ATE 102 via the probe card 104. For test output signal, the TDO 410 of chips 302, 304, 306 and 308 are connected to a respective I/O channel of the ATE 102. In operation, the ATE 102 drives the JTAG test signals to the TCK 402, TMS 404, TDI 406, and TRST 408 of chip 302. The test signals are simultaneously sent to TCK 402, TMS 404, TDI 406, and TRST 408 of chips 304, 306 and 308 respectively via the metal wires in kerf regions 310. Thus, parallel testing of chips 302, 304, 306 and 308 may be performed simultaneously.

Once the test is complete, the test result of chips 302, 304, 306 and 308 are returned from the TDO 410 of chips 302, 304, 306 and 308 via the probe card 104 respectively to the ATE 102. With this configuration, only a single set of I/O channels from the ATE is necessary to perform parallel testing of chips 302, 304, 306 and 308. In this example, only 4 instead of 16 ATE I/O channels are required to parallel test chips 302, 304, 306 and 308 because typically four I/O channels from the ATE 102 are required to test each chip.

Referring to FIG. 5, a flowchart of an exemplary process for parallel testing of multiple semiconductor chips is depicted in accordance with one embodiment of the present disclosure. Process 500 begins at step 502 to provide multiple semiconductor chips in a single die. In one embodiment, the multiple semiconductor chips are identical to one another. For example, in FIG. 3, chips 302, 304, 306 and 308 are provided in a single die 300.

Process 500 continues to step 504 to connect one or more test ports of the multiple semiconductor chips via at least one connection, such as metal wires in the kerf regions. For example, as shown in FIG. 3, port A of chip 302 is connected with port A of chips 304, 306 and 308, and port C of chip 302 is connected to port C of chips 304, 306 and 308 via metal wires in kerf regions 310.

Process 500 then continues to step 506 to send test data from I/O channels of the ATE to one or more test input ports of the first chip. For example, as shown in FIG. 4, test signal TCK is sent from TCK channel of ATE 102 to TCK port 402 of first semiconductor chip 302. Process 500 then continues to step 508 to pass test data received at one or more test input ports of the first semiconductor chip to one or more test input ports of other chips via the at least one connection, such as metal wires in the kerf regions. In this way, one or more test input ports of other chips receive the same test data from the input channels of the ATE. For example, in FIG. 4, test data TCK 402 received by first semiconductor chip 302 is passed to TCK port 402 of chips 304, 306 and 308 via metal wires in kerf regions 310.

Once the test is complete, process 500 completes at step 510 to return test results from one or more test output ports of the chips 302, 304, 306 and 308 to the respective I/O channels of the ATE. For example, in FIG. 4, test results are passed from TDO port 410 of chips 302, 304, 306 and 308 to respective TDO channels of ATE 102.

In addition to connecting test input/output ports of the first chip to the test input/output ports of other chips in the single die via metal wires in kerf regions, core logic may be implemented within the multiple semiconductor chips internally to share ATE I/O channels via the at least one connection, such as metal wires in kerf regions. In this embodiment, the internal core logic of the semiconductor chips turns on internal transmission paths to transfer test data from contacts or pads of one chip to corresponding contacts or pads of other chips in the die. The connection between contacts or pads of the multiple semiconductor chips may be implemented using metal wires in kerf regions. Through this internal core logic, multiple semiconductor chips may be tested simultaneously with a single set of I/O channels from the automated test equipment 102 that typically only accommodates one semiconductor chip.

Figure 6:
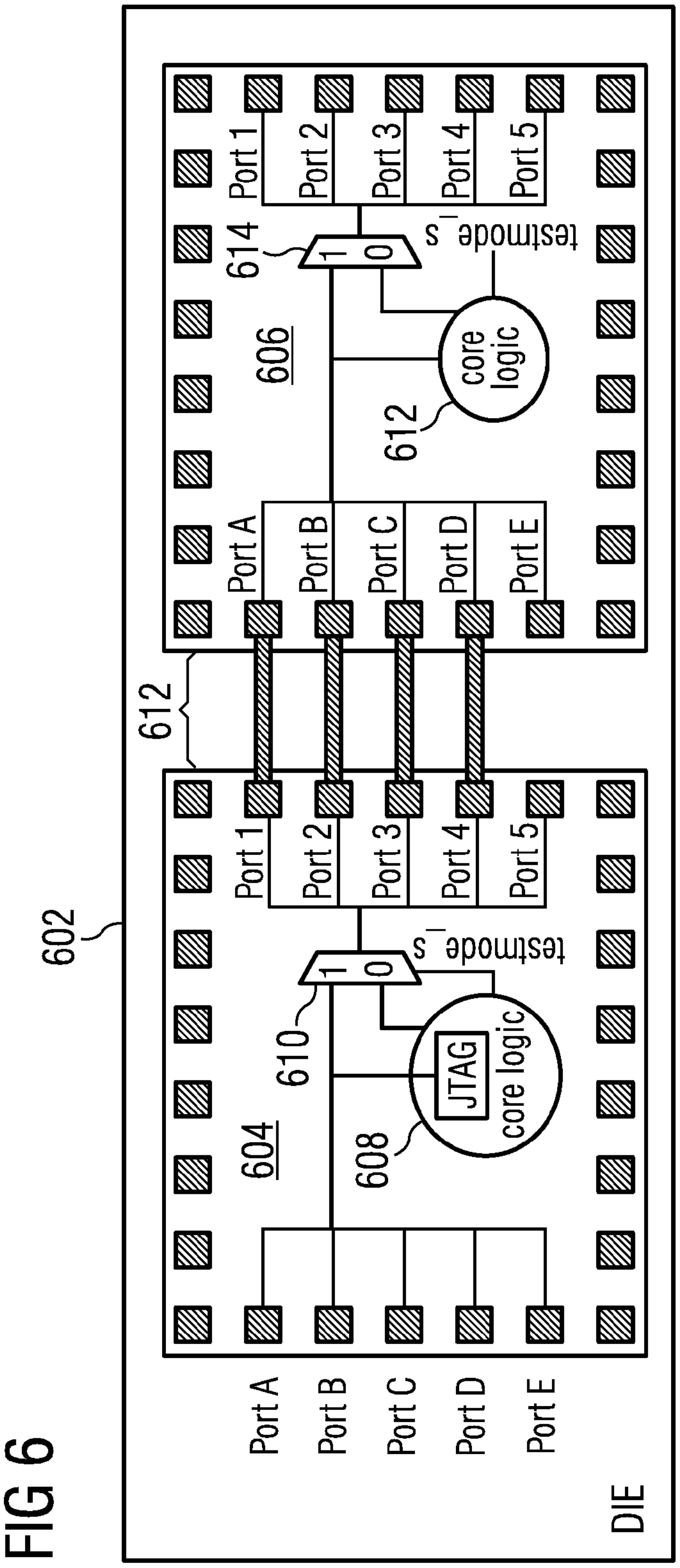
FIG. 6 is a diagram illustrating a system for wafer level parallel testing of multiple semiconductor chips in accordance with an alternative embodiment of the present disclosure.

Referring to FIG. 6, a diagram illustrating a system for wafer level parallel testing of multiple semiconductor chips is depicted in accordance with an alternative embodiment of the present disclosure. In this alternative embodiment, multiple semiconductor chips 604 and 606 are provided in a single die 602. In one embodiment, chips 604 and 606 are identical to one another. Each chip comprises an internal core logic that turns on internal transmission paths to pass test data or signals from contacts or pads of one chip to corresponding contacts or pads of another chip. For example, core logic 608 controls chip 604. When a test mode is entered, for example, through a multiplexer 610, the internal paths between ports A, B, C, D, and E and ports 1, 2, 3, 4, and 5 of chip 604 are connected respectively. Thus, the core logic 608 is configured to connect a first set of ports and a second set of ports in chip 604.

The second set of ports, ports 1, 2, 3, 4, and 5 of chip 604, are connected to ports A, B, C, D, and E of chip 606 respectively by at least one connection, such as metal wires in kerf regions 612. When the test signals or data are sent from the ATE to ports A, B, C, D, and E of chip 604, the internal paths between ports 1, 2, 3, 4, and 5 and ports A, B, C, D, and E of chip 604 are connected respectively by core logic 608. Test signals or data are then passed from ports 1, 2, 3, 4, and 5 of chip 604 to ports A, B, C, D, and E of chip 606 respectively via the at least one connection, such as metal wires in the kerf regions 612.

Although not shown in FIG. 6, ports 1, 2, 3, 4, and 5 of chip 606 may be connected to ports A, B, C, D, and E of other chips in die 602 by the at least one connection, such as metal wires in kerf regions 612. In that case, core logic 612 controls chip 606. When a test mode is entered, for example, through a multiplexer 614, the internal paths from ports A, B, C, D, and E to ports 1, 2, 3, 4, and 5 of chip 606 are connected respectively by core logic 612 and test signals or data may be passed to ports A, B, C, D, and E of other chips respectively. With this configuration, less I/O channels are required from the ATE 102 to test multiple semiconductor chips. This means that more chips may be tested at the wafer level simultaneously with the same number of ATE I/O channels. As a result, testing costs for multiple semiconductor chips may be reduced.

Figure 7:
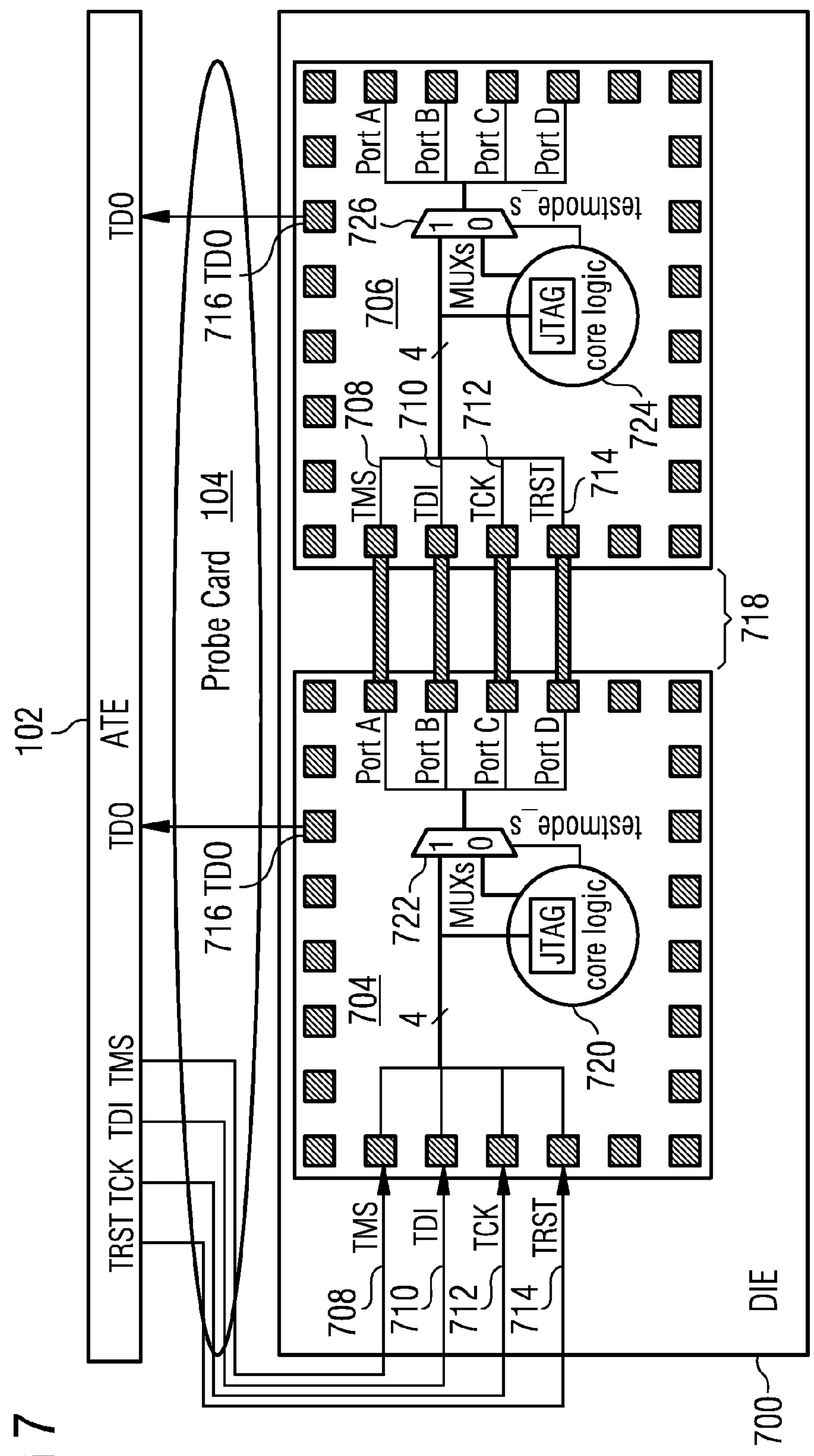
FIG. 7 is a diagram of an alternative exemplary implementation of a system for wafer level parallel testing of multiple semiconductor chips in accordance with one embodiment of the present disclosure.

Referring to FIG. 7, a diagram illustrating an exemplary implementation of a system for wafer level parallel testing of multiple semiconductor chips is depicted in accordance with an alternative embodiment of the present disclosure. In this exemplary implementation, two semiconductor chips 704 and 706 are provided in a single die 700. In one embodiment, chips 704 and 706 are identical to one another.

Parallel testing of chips 704 and 706 may be performed via four JTAG signals: TMS 708, TDI 710, TCK 712, and TRST 714. Automated test equipment (ATE) 102 may configure chips 704 and 706 via these four signals to invoke a specific test, for example, ATPG test, memory test, etc. The result of the test may be returned via TDO 716 signal to respective channels of the ATE 102.

For test input signals, the four JTAG signals of chips 704 and 706 are connected via at least one connection, such as metal wires in the kerf regions 718, and the four JTAG signals of chip 704 are connected to the ATE 102 via the probe card 104. In this example, ports A, B, C, and D of chip 704 are connected to ports TMS 708, TDI 710, TCK 712, and TRST 714 of chip 706 via the at least one connection, such as metal wires in kerf regions 718. For test output signal, the TDO 716 of chips 704 and 706 are connected to respective I/O channel of the ATE 102 via the probe card 104.

In operation, the ATE 102 drives the JTAG test signals to the TMS 708, TDI 710, TCK 712, and TRST 714 of chip 704. Core logic 720 is provided to control chip 704. When the test signals are sent from the ATE 102 to ports TMS 708, TDI 710, TCK 712, and TRST 714 of chip 704 via probe card 104, the internal transmission paths between ports A, B, C, and D and ports TMS 708, TDI 710, TCK 712, and TRST 714 of chip 704 are connected by core logic 720. Thus, the core logic 720 is configured to connect a first set of ports and a second set of ports in chip 704.

Thereafter, test signals are passed from ports A, B, C, and D of chip 704 to ports TMS 708, TDI 710, TCK 712, and TRST 714 of chip 706 via the at least one connection, such as metal wires in kerf region 718. Thus, parallel testing of chips 704 and 706 may be performed simultaneously. Although not shown in FIG. 7, ports A, B, C, and D of chip 706 may be connected to ports TMS 708, TDI 710, TCK 712, and TRST 714 of other chips in die 700 by at least one connection, such as metal wires in kerf regions 718.

In one case, for example, core logic 724 controls chip 706. When a test mode is entered, for example, through a multiplexer 726, the internal transmission paths between ports TMS 708, TDI 710, TCK 712, and TRST 714 and ports A, B, C, and D of chip 706 are connected respectively by core logic 724. Thus, the core logic 724 is configured to connect a first set of ports and a second set of ports in chip 706. Test signals or data may be passed to ports TMS 708, TDI 710, TCK 712, and TRST 714 of other chips via the at least one connection, such as metal wires in kerf regions 718, from ports A, B, C, and D of chip 706.

Once the test is complete, the test results of chips 704 and 706 are returned from the TDO 716 of chips 704 and 706 via the probe card 104 to respective I/O channels of the ATE 102. With this configuration, only a single set of I/O channels from the ATE 102 is necessary to perform parallel testing of chips 704 and 706. In this example, only 4 instead of 8 ATE I/O channels are required to parallel test chips 704 and 706 because typically four I/O channels from the ATE 102 are required to test each chip.

Referring to FIG. 8, a flowchart of an exemplary process for parallel testing of multiple semiconductor chips is depicted in accordance with an alternative embodiment of the present disclosure. Process 800 begins at step 802 to provide multiple semiconductor chips in a single wafer. In one embodiment the multiple semiconductor chips are identical to one another. For example, in FIG. 6, chips 604 and 606 are provided in a single die 602.

Process 800 continues to step 804 to provide one or more core logic to control one or more chips. For example, as shown in FIG. 6, core logic 608 and 612 are provided to control chips 604 and 606 respectively. Process 800 then continues to step 806 to connect one or more ports of the first semiconductor chip to one or more test input ports of another chip via at least one connection, such as metal wires in the kerf regions. For example, as shown in FIG. 6, port 1 of chip 604 is connected with port A of chip 606, and port 2 of chip 604 is connected to port B of chip 606 via metal wires in kerf regions 612.

Process 800 then continues to step 808 to send test data from I/O channels of the ATE to one or more test input ports of the first semiconductor chip. For example, as shown in FIG. 7, test signal TMS is sent from TMS channel of ATE 102 to TMS port 708 of first semiconductor chip 704. Process 800 then continues to step 810 in which core logic of first semiconductor chip enables internal paths to pass test signals or data from one or more test input ports of the first semiconductor chip to one or more test input ports of another semiconductor chip via at least one connection, such as metal wires in the kerf regions. In this way, one or more test input ports of another chip receive the same test data from the input channels of the ATE. For example, in FIG. 7, internal paths between port TMS 708 and port A of chip 704 are connected by core logic 720 and test data TMS 708 received by first semiconductor chip 704 is passed from port A of chip 704 to port TMS 702 of chip 706 via the at least one connection, such as metal wires in kerf regions 718.

Once the test is complete, process 800 completes at step 812 to return test results from one or more test output ports of the chips to the respective I/O channels of the ATE. For example, in FIG. 7, test results are passed from TDO port 716 of chips 704 and 706 to TDO channels of ATE 102.

As discussed above, in addition to connecting the one or more test input ports of the first semiconductor chip to one or more test input ports of another chip via metal wires in the kerf regions, the core logic of the first semiconductor chip may be configured such that one or more test input ports of other chips in the die may be connected to the first semiconductor chip in order to parallel test the other chips simultaneously.

Figure 9:
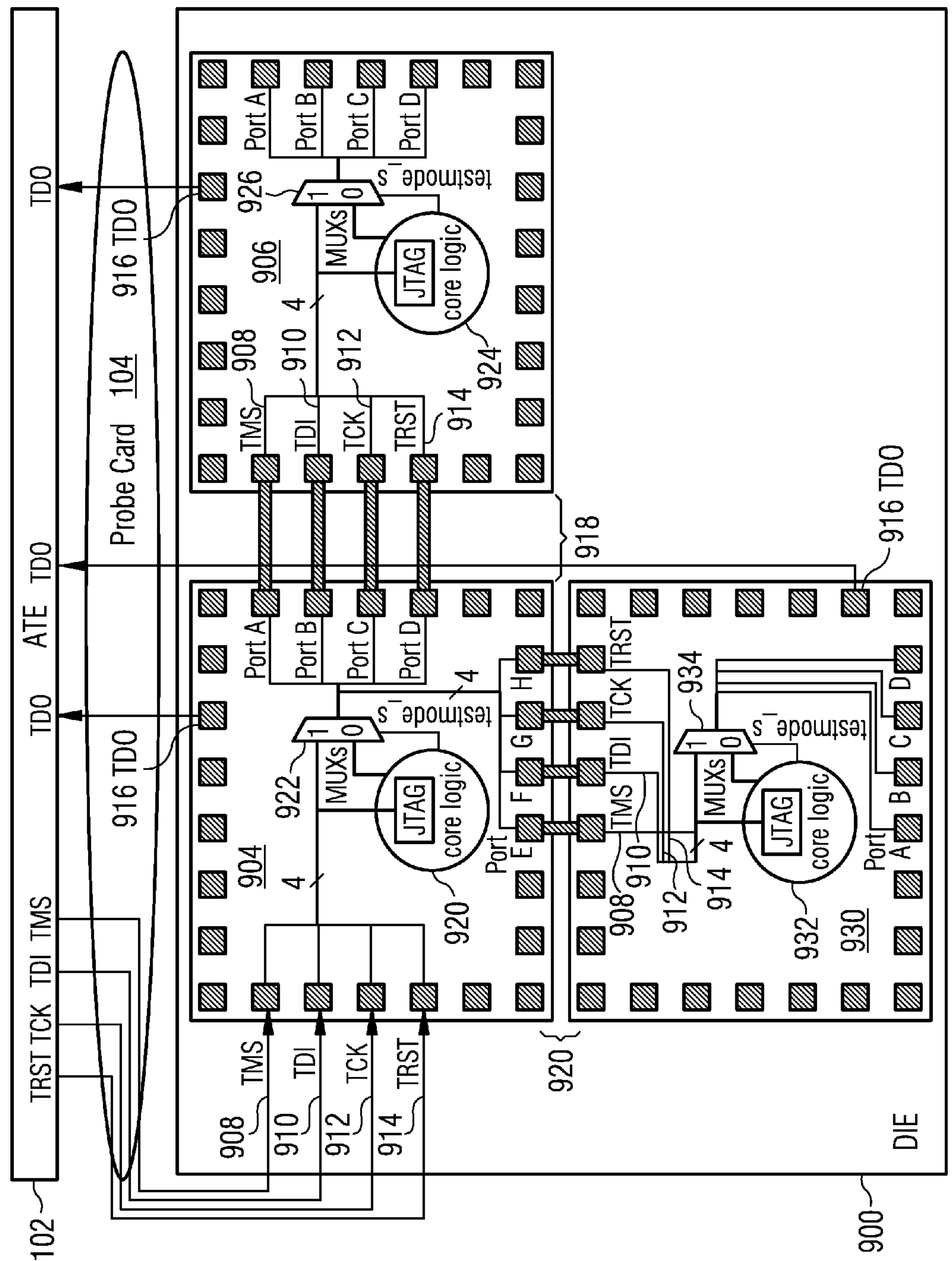
FIG. 9 is a diagram illustrating an exemplary implementation of a system for wafer level parallel testing of multiple semiconductor chips in accordance with yet another alternative embodiment of the present disclosure.

Referring to FIG. 9, a diagram illustrating an exemplary implementation of a system for wafer level parallel testing of multiple semiconductor chips is depicted in accordance with yet another alternative embodiment of the present disclosure. In this exemplary implementation, three semiconductor chips 904, 906, and 930 are provided in a single die 900. In one embodiment, chips 904, 906, and 930 may be identical to one another.

Parallel testing of chips 904, 906, and 930 may be performed via four JTAG signals: TMS 908, TDI 910, TCK 912, and TRST 914. Automated test equipment (ATE) 102 may configure chips 904, 906, and 930 via these four signals to invoke a specific test, for example, ATPG test, memory test, etc. The result of the test may be returned via TDO 916 signal to respective I/O channels of the ATE 102.

For test input signals, the four JTAG signals of chips 904, 906, and 930 are connected via at least one connection, such as metal wires in the kerf regions 918 and the four JTAG signals of chip 904 are connected to the respective I/O channels of the ATE 102 via the probe card 104. In this example, ports A, B, C, and D of chip 904 are connected to ports TMS 908, TDI 910, TCK 912, and TRST 914 of chip 906 via a first subset of connections, such as metal wires in kerf regions 918. In addition, ports E, F, G, and H of chip 904 are connected to ports TMS 708, TDI 910, TCK 912, and TRST 914 of chip 930 via a second subset of connections, such as metal wires in kerf regions 920. For test output signal, the TDO 916 of chips 904, 906, and 930 are connected to respective I/O channels of the ATE 102 via the probe card 104.

In operation, the ATE 102 drives the JTAG test signals to the TMS 908, TDI 910, TCK 912, and TRST 914 of chip 904. Core logic 920 is provided to control chip 904. When the test signals are sent from the ATE 102 to TMS 908, TDI 910, TCK 912, and TRST 914 of chip 904 via probe card 104, chip 904 enters into a test mode, for example, via a multiplexer 922, and core logic 920 enables internal transmission paths between ports A, B, C, and D and ports TMS 908, TDI 910, TCK 912, and TRST 914 of chip 904. Thus, the core logic 920 is configured to connect a first set of ports, ports TMS 908, TDI 910, TCK 912, and TRST 914, and a second set of ports, ports A, B, C, and D, of chip 904.

Thereafter, test signals are passed from ports A, B, C, and D of chip 904 to ports TMS 908, TDI 910, TCK 912, and TRST 914 of chip 906 via a first subset of connections, such as metal wires in kerf region 918. Thus, parallel testing of chips 904 and 906 may be performed simultaneously.

In addition, core logic 920 may control chip 904 to pass test signals to a third set of ports, ports E, F, G, and H of chip 904 simultaneously. Because ports E, F, G, and H of chip 904 are connected to ports TMS 908, TDI 910, TCK 912, and TRST 914 of chip 930 via a second subset of connections, such as metal wires in kerf regions 920, parallel testing of chips 904, 906 and 930 may be performed simultaneously.

In this case, core logic 920 in chip 904 enables internal transmission paths between ports A, B, C, and D and ports TMS 908, TDI 910, TCK 912, and TRST 914 of chip 904 when a test mode is entered, for example, via a multiplexer 922. The core logic 920 is also configured to connect a first set of ports, ports TMS 908, TDI 910, TCK 912, and TRST 914, with a third set of ports, ports E, F, G, and H, in chip 904.

Thereafter, test signals are passed from the third set of ports, ports E, F, G, and H of chip 904 to ports TMS 908, TDI 910, TCK 912, and TRST 914 of chip 930 via a second subset of connections, such as the metal wires in kerf region 920. Thus, parallel testing of chips 904, 906 and 930 may be performed simultaneously.

Upon receiving test signals from chip 904 at ports TMS 908, TDI 910, TCK 912, and TRST 914, chip 930 enters into a test mode, for example, through a multiplexer 934, core logic 932 in turn enables internal transmission paths between ports TMS 908, TDI 910, TCK 912, and TRST 914 and ports A, B, C, and D of chip 930 respectively. Thus, the core logic 932 is configured to connect a first set of ports and a second set of ports in chip 930. Test signals or data may be sent from ports TMS 908, TDI 910, TCK 912, and TRST 914 to ports A, B, C, and D of chip 930. Although not shown in FIG. 9, test signals may be passed from ports A, B, C, and D of chip 930 to TMS 908, TDI 910, TCK 912, and TRST 914 of other chips in die 900 in a similar manner without departing the spirit and scope of the present disclosure.

Once the test is complete, the test results of chips 904, 906, and 930 are returned from the TDO 916 of chips 904, 906, 930 via the probe card 104 to the respective I/O channels of the ATE 102. With this configuration, only a single set of I/O channels from the ATE 102 is necessary to perform parallel testing of chips 904, 906, and 930. In this example, only 4 instead of 12 ATE I/O channels are required to parallel test chips 904, 906, and 930 because typically four I/O channels from the ATE 102 are required to test each chip.

Figure 10:
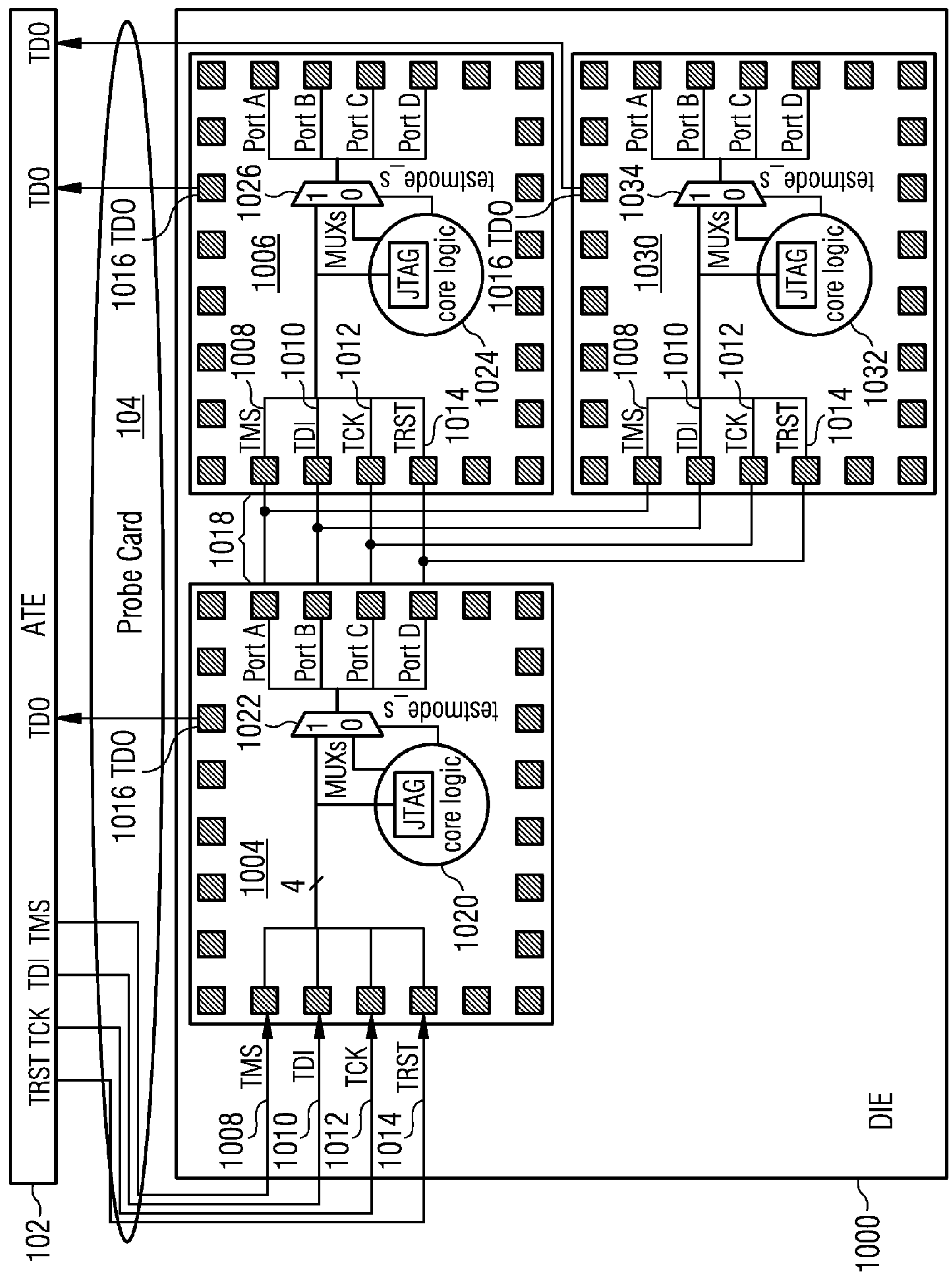
FIG. 10 is a diagram illustrating an exemplary implementation of a system for wafer level parallel testing of multiple semiconductor chips in accordance with yet another alternative embodiment of the present disclosure.

Referring to FIG. 10, a diagram illustrating an exemplary implementation of a system for wafer level parallel testing of multiple semiconductor chips is depicted in accordance with yet another alternative embodiment of the present disclosure. In this exemplary implementation, three semiconductor chips 1004, 1006, and 1030 are provided in a single die 1000. In one embodiment chips 1004, 1006, and 1030 are identical to one another.

Parallel testing of chips 1004, 1006, and 1030 may be performed via four JTAG signals: TMS 1008, TDI 1010, TCK 1012, and TRST 1014. Automated test equipment (ATE) 102 may configure chips 1004, 1006, and 1030 via these four signals to invoke a specific test, for example, ATPG test, memory test, etc. The result of the test may be returned via TDO 1016 signal to ATE 102.

For test input signals, the four JTAG signals of chips 1004, 1006, and 1030 are connected via at least one connection, such as metal wires in the kerf regions 1018 and the four JTAG signals of chip 1004 are connected to the respective I/O channels of the ATE 102 via the probe card 104. In this example, ports A, B, C, and D of chip 1004 are connected to ports TMS 1008, TDI 1010, TCK 1012, and TRST 1014 of chip 1006 via a first subset of connections, such as metal wires in kerf regions 1018. In addition, ports A, B, C, and D of chip 1004 are connected to ports TMS 1008, TDI 1010, TCK 1012, and TRST 1014 of chip 1030 via a second subset of connections, such as metal wires in kerf regions 1018. For test output signal, the TDO 1016 of chips 1004, 1006, and 1030 are connected to respective I/O channels of the ATE 102 via the probe card 104.

In operation, the ATE 102 drives the JTAG test signals to the TMS 1008, TDI 1010, TCK 1012, and TRST 1014 of chip 1004. Core logic 1020 is provided to control chip 1004. When the test signals are sent from the ATE 102 to TMS 1008, TDI 1010, TCK 1012, and TRST 1014 of chip 1004 via probe card 104, chip 1004 enters into a test mode, for example, via a multiplexer 1022, and core logic 1020 enables internal transmission paths between ports A, B, C, and D and ports TMS 1008, TDI 1010, TCK 1012, and TRST 1014 of chip 1004. Thus, the core logic 1020 is configured to connect a first set of ports, ports TMS 1008, TDI 1010, TCK 1012, and TRST 1014, and a second set of ports, ports A, B, C, and D, in chip 1004.

Thereafter, test signals are passed from ports A, B, C, and D of chip 1004 to ports TMS 1008, TDI 1010, TCK 1012, and TRST 1014 of chip 1006 via a first subset of connections, such as the metal wires in kerf region 1018. Thus, parallel testing of chips 1004 and 1006 may be performed simultaneously.

In addition, core logic 1020 may control chip 1004 to pass test signals to a third set of ports, ports TMS 1008, TDI 1010, TCK 1012, and TRST 1014 of chip 1030 simultaneously. Because ports A, B, C, and D of chip 1004 are connected to ports TMS 1008, TDI 1010, TCK 1012, and TRST 1014 of chip 1030 via a second subset of connections, such as metal wires in kerf regions 1018, parallel testing of chips 1004, 1006 and 1030 may be performed simultaneously.

In this case, core logic 1020 in chip 1004 enables internal transmission paths between ports A, B, C, and D and ports TMS 1008, TDI 1010, TCK 1012, and TRST 1014 of chip 1004 when a test mode is entered, for example, via a multiplexer 1022. Thereafter, test signals are passed from the second set of ports, ports A, B, C, and D of chip 1004 to ports TMS 1008, TDI 1010, TCK 1012, and TRST 1014 of chip 1030 via a second subset of connections, such as the metal wires in kerf region 1018. Thus, parallel testing of chips 1004, 1006 and 1030 may be performed simultaneously.

Upon receiving test signals from chip 1004 at ports TMS 1008, TDI 1010, TCK 1012, and TRST 1014, chip 1030 enters into a test mode, for example, through a multiplexer 1034, core logic 1032 in turn enables internal transmission paths between ports TMS 1008, TDI 1010, TCK 1012, and TRST 1014 and ports A, B, C, and D of chip 1030 respectively. Thus, the core logic 1032 is configured to connect a first set of ports and a second set of ports in chip 1030. Test signals or data may be sent from ports TMS 1008, TDI 1010, TCK 1012, and TRST 1014 to ports A, B, C, and D of chip 1030. Although not shown in FIG. 10, test signals may be passed from ports A, B, C, and D of chip 1030 to ports TMS 1008, TDI 1010, TCK 1012, and TRST 1014 of other chips in die 900 in a similar manner without departing the spirit and scope of the present disclosure.

Once the test is complete, the test results of chips 1004, 1006, and 1030 are returned from the TDO 1016 of chips 1004, 1006, 1030 via the probe card 104 to the respective I/O channels of the ATE 102. With this configuration, only a single set of I/O channels from the ATE 102 is necessary to perform parallel testing of chips 1004, 1006, and 1030. In this example, only 4 instead of 12 ATE I/O channels are required to parallel test chips 1004, 1006, and 1030 because typically four I/O channels from the ATE 102 are required to test each chip.

It is noted that the configurations shown in the above figures are for illustrations only. Additional semiconductor chips, core logic, and/or multiplexers may be included in the above configurations without departing the spirit and scope of the present disclosure. With the additional configurations, the number of semiconductor chips to be tested at the wafer level by the ATE simultaneously may increase exponentially as less ATE I/O channels are required. Consequently, the cost of testing multiple semiconductor chips may be reduced.

It should be noted that the method described herein does not have to be executed in the order described. Moreover, various activities described with respect to the method can be executed in repetitive, simultaneous, serial, or parallel fashion.

What is claimed:

1. A system for testing semiconductor chips comprising:

a plurality of semiconductor chips disposed in a wafer, each of the plurality of semiconductor chips having a first set of ports, a second set of ports, at least one test output port, at least one internal core logic, wherein at least one port of the first set of ports is for receiving test data;

at least one connection disposed in a kerf region of the wafer between at least one port of the second set of ports of a first semiconductor chip and at least one port of the first set of ports of at least one second semiconductor chip in the plurality of semiconductor chips;

wherein test data sent from a tester exclusively to the at least one port of the first set of ports of the first semiconductor chip is passed through an internal path of the first semiconductor chip and to the at least one port of the first set of ports of the at least one second semiconductor chip via the at least one connection, wherein the internal core logic enables the internal path of the first semiconductor chip to connect the at least one port of the first set of ports for receiving test data to the at least one port of the second set of ports of the first semiconductor chip;

wherein the at least one test output port of each of the plurality of semiconductor chips is individually connected to the tester, wherein the tester is external to the wafer.

2. The system of claim 1, wherein the plurality of semiconductor chips are identical to one another.

3. The system of claim 1, wherein the at least one connection comprises:

a first connection disposed in the kerf region between one of the second set of ports of the first semiconductor chip and one of the first set of ports of the at least one second semiconductor chip; and a second connection disposed in the kerf region between a second one of the second set of ports of the first semiconductor chip and a second one of the first set of ports of the at least one second semiconductor chip.

4. The system of claim 3, wherein the first semiconductor chip is configured to send the test data to the at least one second semiconductor chip via the first connection and the second connection simultaneously.

5. The system of claim 1, wherein at least one port of the first set of ports of each of the plurality of semiconductor chips comprises at least one test input port.

6. The system of claim 5, wherein the tester is an automated test equipment comprising:

at least one channel coupled to the at least one test input port of the first semiconductor chip; and at least one channel coupled to the at least one test output port of the plurality of semiconductor chips.

7. The system of claim 6, wherein the first semiconductor chip is configured to receive the test data from the at least one channel of the automated test equipment at the at least one test input port of the first semiconductor chip.

8. The system of claim 7, wherein the first semiconductor is configured to send the test data received at the at least one test input port to the at least one test input port of the at least one second semiconductor chip via the at least one connection.

9. A method for testing semiconductor chips comprising:

providing a plurality of semiconductor chips in a wafer, each of the plurality of semiconductor chips comprising one or more first ports, one or more second ports, at least one output port, and an internal core logic;

connecting the one or more second ports of one or more of the plurality of semiconductor chips to at least one connection in a kerf region of the wafer;

sending test data from a tester exclusively to the one or more first ports of a first semiconductor chip in the plurality of semiconductor chips; and receiving the test data from at least one channel of the tester to the one or more first ports of the first semiconductor chip;

passing the test data from the one or more first ports through an internal path of the first semiconductor chip to the one or more first ports of at least one second semiconductor chip via the at least one connection, the passing comprising connecting, by the internal core logic of the first semiconductor chip, the one or more first ports of the first semiconductor chip to the one or more second ports of the first semiconductor chip, wherein the tester is external to the plurality of semiconductor chips.

10. The method of claim 9, wherein connecting the one or more second ports of the plurality of semiconductor chips to at least one connection in a kerf region of the wafer comprises:

connecting one or more of the second ports of the first semiconductor chip to one or more of the one or more first ports of the at least one second semiconductor chip via a first connection in the kerf region; and connecting another one or more of the second ports of the first semiconductor chip to one or more of the one or more first ports of the at least one second semiconductor chip via a second connection in the kerf region.

11. The method of claim 10, wherein the one or more first ports are at least one test input port for receiving the test data.

12. The method of claim 10, wherein the test data is sent to the one or more first ports of the at least one second semiconductor chip via the first connection and second connection simultaneously.

13. A system for testing semiconductor chips comprising:

a plurality of identical semiconductor chips disposed in a wafer, each of the plurality of semiconductor chips comprising a first set of ports, at least one port of the first set of ports for receiving test data, a second set of ports, at least one output port and at least one internal core logic;

at least one connection disposed in a kerf region of the wafer between at least one port of the second set of ports of a first semiconductor chip and at least one port of the first set of ports of at least one second semiconductor chip in the plurality of semiconductor chips, wherein test data is sent from a tester exclusively to the at least one port of the first set of ports for receiving data of the first semiconductor chip passes internally through the first semiconductor to the at least one port of the second set of ports of the at least one second semiconductor chip via the at least one connection, wherein the internal core logic of the first semiconductor chip selectively enables an internal path of the first semiconductor chip to connect the at least one port of the first set of ports for receiving test data of the first semiconductor chip to the at least one port of the second set of ports of the first semiconductor chip, wherein the at least one output port of each of the plurality of semiconductor chips is individually connected to the tester, and wherein the tester is external to the wafer.

14. The system of claim 13, wherein one or more of the second set of ports of the first semiconductor chip is coupled to one or more of the first set of ports of a second semiconductor chip via a first connection of the at least one connection and one or more of the second set of ports of the first semiconductor chip is coupled to one or more of the first set of ports of a third semiconductor chip via second connection of the at least one connection.

15. The system of claim 13, wherein the first semiconductor chip comprises:

a third set of ports coupled to the first set of ports of a third semiconductor chip in the at least one second semiconductor chip via a second connection disposed in a kerf region.

16. The system of claim 15, wherein the internal core logic selectively enables an internal path of the first semiconductor chip to connect at least one of the first set of ports for receiving test data to at least one of the third set of ports so as to pass the test data to the first set of ports of the third semiconductor chip via the second connection.

17. A method for testing semiconductor chips comprising:

providing a plurality of semiconductor chips in a wafer, each of the plurality of semiconductor chips comprising first set of ports, a second set of ports, and an internal core logic;

connecting at least one port of the second set of ports of a first semiconductor chip of the plurality of semiconductor chips to at least one connection in a kerf region of the wafer;

configuring the internal core logic to connect at least one of the first set of ports of the first semiconductor chip to at least one of the second set of ports of the first semiconductor chip connected to the at least one connection upon the first semiconductor chip entering a test mode;

sending test data from a tester exclusively to the at least one of the first set of ports of the first semiconductor chip in the plurality of semiconductor chips; and passing the test data from the at least one port of the first set of ports of the first semiconductor chip internally through the first semiconductor chip to at the least one of the second ports of the first semiconductor chip and to at least one second semiconductor chip via the at least one connection, wherein the tester is external to the plurality of semiconductor chips.

18. The method of claim 17, wherein sending test data from a tester to the at least one port of the first set of ports of the first semiconductor chip in the plurality of semiconductor chips comprises:

receiving the test data from at least one channel of the tester at the at least one of the first set of ports of the first semiconductor chip; and sending the test data from the at least one of the first set of ports to the at least one of the second set of ports of the first semiconductor chip via at least one internal path.

19. The method of claim 17, wherein connecting at least one port of the second set of ports of the first semiconductor chip to the at least one connection in a kerf region of the wafer comprises:

connecting the at least one of second set of ports of the first semiconductor chip to at least one of the first ports of a second semiconductor chip of the at least one second semiconductor chip via a first subset of the at least one connection; and connecting at least another one of the second set of ports of the first semiconductor chip to at least one of the first ports of a third semiconductor chip of the at least one second semiconductor chip via a second subset of the at least one connection.

20. The method of claim 19, wherein passing the test data from the at least one port of the first set of ports of the first semiconductor chip to the at least one port of the second set of ports of the first semiconductor chip and to at least one second semiconductor chip via the at least one connection comprises:

sending the test data from the at least one of the second set of ports of the first semiconductor chip to at least one of the first ports of the second semiconductor chip of the at least one second semiconductor chip via the first subset of the at least one connection; and sending the test data from the at least another one of the second set of ports of the first semiconductor chip to at least one of the first ports of the third semiconductor chip of the at least one second semiconductor chip via the second subset of the at least one connection simultaneously.

21. The method of claim 17, the method further comprising:

configuring the internal core logic to connect at least one of the first set of ports of the first semiconductor chip to at least one of a third set of ports of the first semiconductor chip upon the first semiconductor chip entering a test mode.

22. The method of claim 21, further comprising:

connecting at least one of the third set of ports of the first semiconductor chip to at least one of the first ports of a third semiconductor chip of the at least one second semiconductor chip via a second subset of the at least one connection.

23. The method of claim 22, further comprising:

passing the test data from the at least one port of the first set of ports of the first semiconductor chip internally through the first semiconductor chip to at the least one of the third ports of the first semiconductor chip and to the third semiconductor chip of at least one second semiconductor chip via the second subset of the at least one connection;

sending the test data from at least one of the second set of ports of the first semiconductor chip to the at least one of the first set of ports of the second semiconductor chip of the at least one second semiconductor chip via the first subset of the at least one connection; and sending the test data from the at least one of the third set of ports of the first semiconductor chip to at least one of the first set of ports of the third semiconductor chip of the at least one second semiconductor chip via the second subset of the at least one connection simultaneously.

* * * * *